(12) United States Patent
Krah et al.

(10) Patent No.: US 11,637,153 B2
(45) Date of Patent: Apr. 25, 2023

(54) DISPLAYS WITH OPTICAL EDGE SENSORS

(71) Applicant: Apple Inc., Cupertino, CA (US)

(72) Inventors: Christoph H. Krah, Cupertino, CA (US); Mohammad Yeke Yazdandoost, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/940,192

(22) Filed: Jul. 27, 2020

(65) Prior Publication Data

US 2021/0098537 A1 Apr. 1, 2021

Related U.S. Application Data

(60) Provisional application No. 62/906,590, filed on Sep. 26, 2019.

(51) Int. Cl.
*G06F 3/041* (2006.01)
*G06F 3/044* (2006.01)
*H01L 27/32* (2006.01)

(52) U.S. Cl.
CPC ............ *H01L 27/323* (2013.01); *G06F 3/044* (2013.01); *G06F 3/0412* (2013.01); *H01L 27/3234* (2013.01)

(58) Field of Classification Search
CPC ... G06F 3/0412; G06F 3/044; H01L 27/3234; H01L 27/323
USPC ..................................... 345/156–175, 76–89
See application file for complete search history.

(56) References Cited

U.S. PATENT DOCUMENTS

| | | | |
|---|---|---|---|
| 7,098,592 | B2 | 8/2006 | Nishikawa |
| 7,230,608 | B2 | 6/2007 | Cok |
| 7,463,248 | B2 | 12/2008 | Hong et al. |
| 2008/0074401 | A1 | 3/2008 | Chung et al. |
| 2010/0321341 | A1 | 12/2010 | Cho et al. |
| 2011/0157097 | A1 | 6/2011 | Hamada et al. |
| 2014/0098065 | A1 | 4/2014 | Deichmann et al. |
| 2014/0183342 | A1* | 7/2014 | Shedletsky ......... H01L 51/5253 250/215 |
| 2016/0041663 | A1 | 2/2016 | Chen et al. |

(Continued)

FOREIGN PATENT DOCUMENTS

| | | | |
|---|---|---|---|
| CN | 104679356 A | 6/2015 | |
| CN | 102687103 B | 4/2016 | |

(Continued)

*Primary Examiner* — Kwin Xie
(74) *Attorney, Agent, or Firm* — Treyz Law Group, P.C.; G. Victor Treyz; Tianyi He

(57) ABSTRACT

A display may have an array of light-emitting pixels that display an image in an active area of the display. These light-emitting pixels may be visible light pixels such as red, green, and blue thin-film organic light-emitting diode pixels. The display may also have a border region that runs along a peripheral edge of the active area. The border region may be free of pixels that display image light, whereas the active area may be free of light detectors. A non-optical touch sensor such as a capacitive touch sensor may overlap the active area to gather touch input from the active area. The non-optical touch sensor may not overlap any portion of the border region. In the border region, an optical sensor formed from infrared light-emitting pixels and infrared light-sensing pixels or other optical sensing circuitry may serve as an optical touch sensor.

23 Claims, 12 Drawing Sheets

(56) References Cited

U.S. PATENT DOCUMENTS

| | | | |
|---|---|---|---|
| 2016/0282975 A1 | 9/2016 | Wu et al. | |
| 2016/0299629 A1* | 10/2016 | Doyle | G02F 1/13338 |
| 2016/0342282 A1* | 11/2016 | Wassvik | G06F 3/0412 |
| 2017/0277323 A1 | 9/2017 | Kim et al. | |
| 2018/0219987 A1* | 8/2018 | Pantel | G06F 1/1637 |
| 2018/0260602 A1* | 9/2018 | He | A61B 5/14542 |

FOREIGN PATENT DOCUMENTS

| | | | | |
|---|---|---|---|---|
| CN | 108595041 A | | 9/2018 | |
| KR | 101808523 B1 * | | 12/2017 | G06F 3/0423 |
| WO | WO-2016048313 A1 * | | 3/2016 | G06F 1/1605 |

* cited by examiner

| FUNCTION | PIXEL ENABLE PEN | GATE ENABLE GEN | DATA ENABLE DEN |
|---|---|---|---|
| OLED UPDATE SAMPLE DATA LINE VOLTAGE ON CST | HIGH | LOW | LOW |
| OLED DRIVING ILLUMINATE OLED BASED ON CONSTANT CURRENT SET BY VOLTAGE ACROSS CST | LOW | X | HIGH |

DISPLAYS WITH OPTICAL EDGE SENSORS

This application claims the benefit of provisional patent application No. 62/906,590, filed Sep. 26, 2019, which is hereby incorporated by reference herein in its entirety.

BACKGROUND

This relates generally to electronic devices and, more particularly, to electronic devices with displays.

Electronic devices often include displays. For example, cellular telephones have displays for presenting information to users. Displays are often provided with capacitive touch sensors for gathering touch input. The incorporation of a capacitive touch sensor into a display allows a user to control device operation using touch input, but may present integration challenges for some cellular telephones.

SUMMARY

A display may have an array of light-emitting pixels that display an image in an active area of the display. These light-emitting pixels may be visible light pixels such as red, green, and blue thin-film organic light-emitting diode pixels. During operation of an electronic device that contains the display, the display may be used in presenting visual content for the user in the active area.

The display may also have a border region that runs along a peripheral edge of the active area. The border region is free of pixels that display image light. A non-optical touch sensor such as a capacitive touch sensor may overlap the active area to gather touch input from the active area. The non-optical touch sensor may not overlap any portion of the border region.

To gather touch input or other user input in the border region, the border region may have an optical sensor. For example, an optical sensor in the border region may be formed from infrared light-emitting pixels and infrared light-sensing pixels. The optical sensing circuitry of the border region may serve as an optical touch sensor. By gathering touch input in the border region using the optical sensor in the border region and by gathering touch input in the active area using the non-optical touch sensor, most or all of the area covering the display may be responsive to user touch input.

The optical sensor may have light-sensing pixels and light-emitting pixels that share common signal lines or the light-sensing pixels may use a first signal line while the light-emitting pixels use a second signal line.

DETAILED DESCRIPTION

Figure 1:
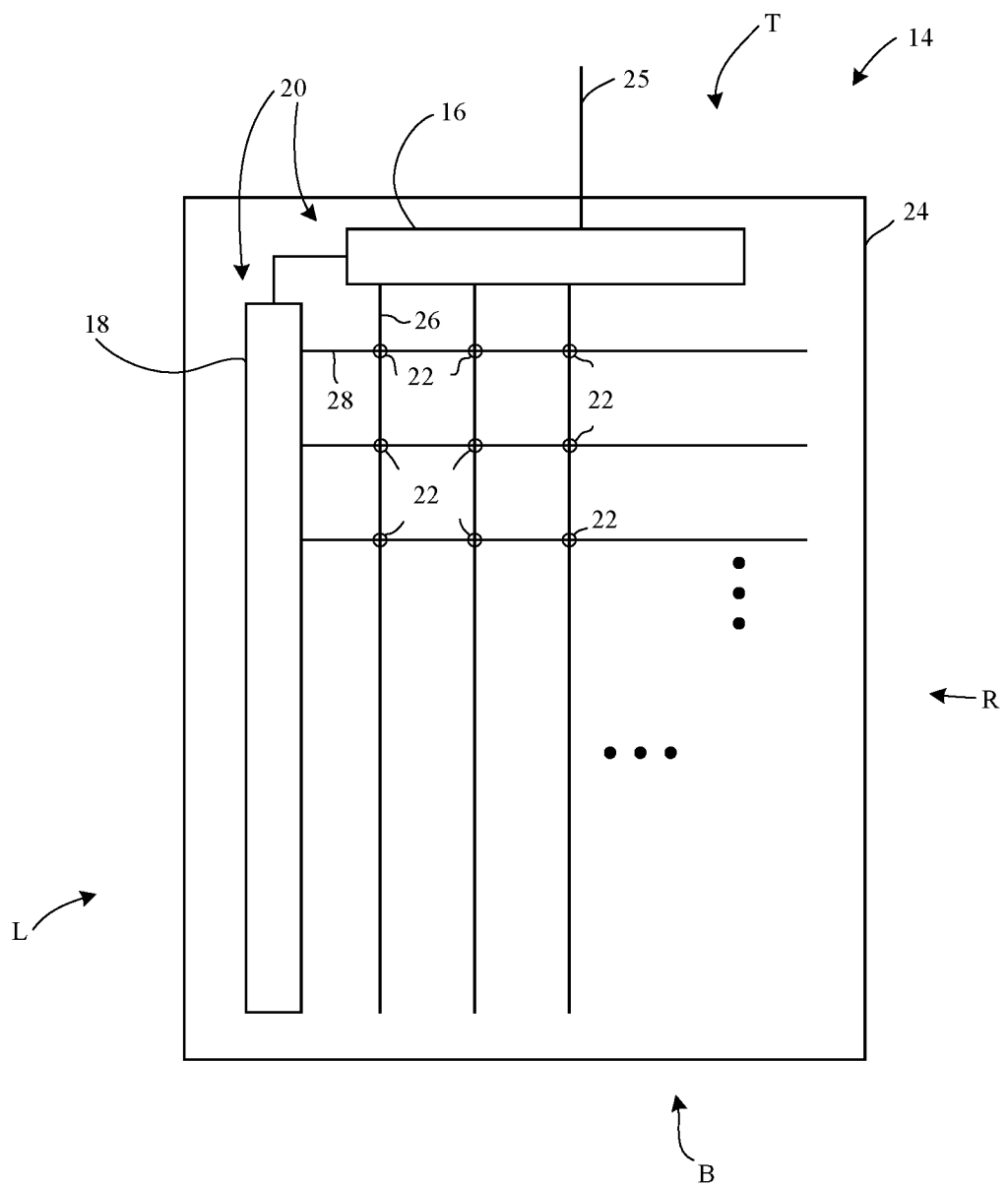
FIG. 1 is a diagram of an illustrative display in accordance with an embodiment.

An electronic device such as a cellular telephone, tablet computer, wristwatch, laptop computer, desktop computer, or other electronic device may have a display such as illustrative display 14 of FIG. 1. In some configurations, display 14 may cover some or all of the front surface of the electronic device.

As shown in FIG. 1, display 14 may have one or more layers such as substrate 24. Layers such as substrate 24 may be formed from insulating materials such as glass, plastic, ceramic, and/or other dielectrics. Substrate 24 may be rectangular or may have other shapes. Rigid substrate material (e.g., glass) or flexible substrate material (e.g., a flexible sheet of polymer such as a layer of polyimide or other materials) may be used in forming substrate 24.

Display 14 may have an array of pixels 22. Pixels 22 may, as an example, be formed from thin-film circuitry such as organic light-emitting diode thin-film circuitry.

Some of pixels 22 emit visible light that creates an image for viewing by a user of display 14 and the device containing display 14. These pixels may be located, for example, in a central active area (AA) of display 14. Other pixels 22 may be used for optical sensing and do not emit image light. Pixels 22 that are used in optical sensing may, in an illustrative configuration, be located along one or more edges of display 14 (e.g., in a border region that covers some or all of the peripheral edge area of display 14 along left edge L, right edge R, top edge T, and/or lower edge B). Configurations in which optical sensing circuitry is provided along the left edge (and, if desired, the right edge) of display 14 may sometimes be described herein as an example.

The optical sensing circuitry of display 14 may have light-sensing pixels for sensing light (e.g., for sensing the magnitude and location of incoming light). The light-sensing pixels may sense visible light, infrared light, and/or ultraviolet light. Some light-emitting pixels in display 14 and/or other light sources in an electronic device may include lasers or light-emitting diodes that emit visible, infrared, and/or ultraviolet light that is used in illuminating a user's fingers or other external objects. Emitted light that has illuminated the user's fingers and that has reflected and/or scattered back towards the light-sensing pixels may provide information about the location of the user's fingers and/or other information (e.g., health information such as heart rate information, fingerprint information, handprint information, and/or other biometric information).

The user's fingers can be detected using this type of optical sensing arrangement when the user's fingers touch display 14 (e.g., optical sensing may be used to implement an optical touch sensor for a fixed-position edge button, an edge button with a movable slider, other touch sensitive icons and buttons on the edge of display 14, etc.) and/or when the user's fingers are in close proximity to display 14 (e.g., optical sensing may be used to implement an optical proximity sensor, an air gesture sensor, a proximity-sensitive edge button, etc.). Configurations in which optical sensing is used to form an optical touch sensor in one or more border regions of display 14 that are free of pixels that emit image light are sometimes described herein as an example. Other portions of display 14 (e.g., the central active area of display 14 that does not include optical sensing circuitry) may be provided with capacitive touch sensing (e.g., a two-dimensional capacitive touch sensor) or other non-optical touch sensor circuitry.

In some configurations, a two-dimensional capacitive touch sensor has electrodes that overlap the active area and that do not overlap any portion of the border region. In the border region, touch input can be gathered using the optical sensor (which, in some embodiments, does not overlap any portion of the active area). Accordingly, the active area can use the capacitive touch sensor to gather touch input, whereas the border region can use the optical sensor to gather touch input. In this way, most or all of the area of display 14 can be touch sensitive, even in arrangements in which it may be challenging to provide capacitive touch sensing along the borders of display 14.

The pixels 22 in display 14 (e.g., the light-emitting pixels and light-sensing pixels) may be formed in rows and columns on substrate 24. There may be any suitable number of rows and columns in the array of pixels 22 (e.g., ten or more, one hundred or more, or one thousand or more).

Display 14 may include display control circuitry 20. The display control circuitry may include display driver circuitry for controlling the light-emitting pixels (e.g., so that the light-emitting pixels in the active area display a desired image). The display control circuitry may also include optical sensor control circuitry for operating the optical sensing circuitry of display 14 (e.g., light-sensing pixels and optional light-emitting pixels in the sensing circuitry). Control circuitry 20 may include on or more integrated circuits and, if desired, may include thin-film circuitry on substrate 24. Control circuitry 20 may be located at one or both ends of display 14 (see, e.g., illustrative circuitry 16 along the top edge T of display 14) and/or may be located along one or both of edges L and R (see, e.g., circuitry 18).

Signal lines on display 14 may be used for distributing power supply signals, data, control signals, and/or other signals for the operation of display 14. Some signal paths may convey signals globally to most or all of pixels 22. For example, display 14 may have a global ground path and other global power supply paths. Other signal paths may be associated with particular rows and may be associated with particular columns of pixels 22. The signal paths for display 14 may, for example, include signal lines that extend vertically (see, e.g., paths 26, each of which is associated with a respective column of pixels 22 and may contain one or more vertically extending lines for that column of pixels 22) and horizontally (see, e.g., paths 28, each of which extends orthogonally to paths 26 and each of which may contain one or more horizontally extending lines associated with a respective row of pixels).

Circuitry 20 may be coupled to control circuitry in an electronic device in which display 14 is mounted using paths such as path 25. Path 25 may be formed from traces on a flexible printed circuit or other signal lines. The control circuitry may be located on a main logic board in an electronic device such as a cellular telephone, wristwatch, computer, or other electronic equipment in which display 14 is being used. During operation, the control circuitry of the electronic device may supply display control circuitry 20 with information on images to be displayed on display 14 and may use display control circuitry gather sensor readings from the optical sensor circuitry in display 14. To display the images on pixels 22, display driver circuitry in circuitry 20 may supply image data to data lines (e.g., data lines in paths 26) while issuing clock signals and other control signals (sometimes referred to as horizontal control signals, emission control signals, scan signal, gate line signals, etc.) that are conveyed to display 14 over paths 28.

The light-emitting pixels of display 14 (whether active area pixels that display images or border pixels that are used to generating infrared light or other light for use in an optical sensor), may include light-emitting devices such as light-emitting diodes or lasers. The light-emitting diodes may be crystalline semiconductor light-emitting dies or thin-film light-emitting diodes. Configurations in which the light-emitting pixels of display 14 are thin-film organic light-emitting diodes are described herein as an example.

Figure 2:
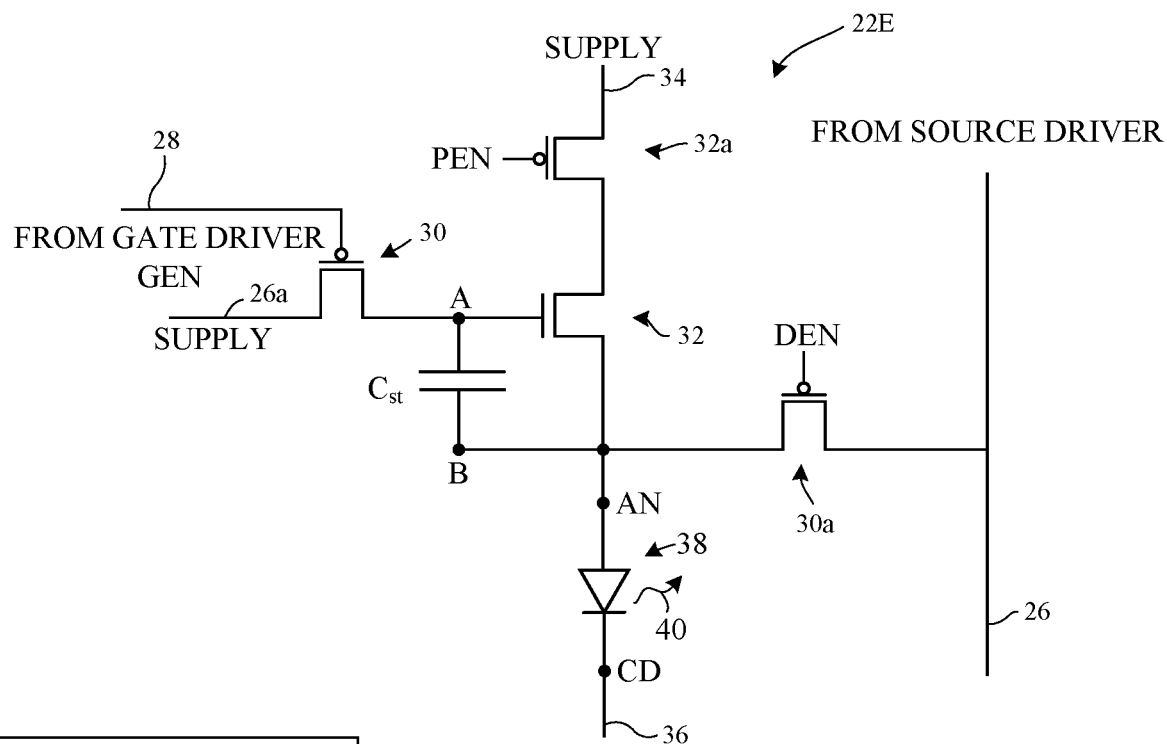
FIG. 2 is a diagram of an illustrative pixel circuit for a display having pixels with light-emitting diodes in accordance with an embodiment.

A schematic diagram of an illustrative pixel circuit for a thin-film organic light-emitting diode pixel is shown in FIG. 2. As shown in FIG. 2, light-emitting pixel 22E may include light-emitting diode 38. A positive power supply voltage may be supplied to positive power supply terminal 34 through p-type field-effect transistor (PFET) 32a and a ground power supply voltage may be supplied to ground power supply terminal 36. PFET 32a is conducting when signal PEN is LOW. Diode 38 has an anode (terminal AN) and a cathode (terminal CD). Transistor 32 forms a constant current source with capacitor Cst, which sets the gate-to-source voltage VGS of transistor 32. The voltage across Cst controls the amount of current through transistor 32 and thus diode 38 and therefore the amount of emitted light 40 from light-emitting pixel 22E. The wavelength of emitted light 40 is determined by the structure of diode 38 and may be, as an example, visible light (e.g., red light, green light, blue light, etc.), infrared light, or ultraviolet light. For example, in the active area of display 14 that displays images, pixels such as pixel 22E may be configured to emit visible light (e.g., red pixels may emit red light, green pixels may emit green light, and blue pixels may emit blue light). In the border region of display 14, pixels 22E may be used to emit infrared light (as an example). Infrared light is not visible to the human eye and therefore will not disturb users of display 14 during optical sensing operations (e.g., the emitted infrared light will not interfere with the visible-light image presented in the active area of display 14). Configurations in which pixels 22E emit visible light in optical sensing regions of display 14 may also be used. For example, the border region of display 14 may include visible light-emitting pixels that help illuminate a user's finger or other external object for optical sensing, but that do not emit visible light that forms part of an image. In some arrangements, ambient light and/or stray light from the active area of display 14 may help illuminate a user's fingers or other external objects that are sensed by light-sensing pixels in display 14.

In light-emitting pixel 22E of FIG. 2, cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). The voltage on the anode AN of each diode is independently controlled to control the amount of light the diode produces for the pixel associated with that diode.

To ensure that transistor 32 is held in a desired state between successive frames of data, pixel 22E may include a storage capacitor such as storage capacitor Cst. The voltage on storage capacitor Cst is applied to the gate of transistor 32 at node A relative to the source of transistor 32 at node AN to control the amount of current through transistor 32. Data can be loaded into storage capacitor Cst using one or more switching transistors such as switching transistor 30 and transistor 30a. When switching transistors 30 and 30a are off, paths 26a and 26 are isolated from storage capacitor Cst and the difference in voltage between gate line 26a and source line 26 is equal to the voltage stored across storage capacitor Cst (i.e., the data value from the previous frame of display data being displayed on display 14). When signal PEN is LOW, transistor 32a turns on, causing the current source formed from transistor 32 and capacitor Cst to turn on and inject current into light-emitting diode 38, which emits light 40 at a level related to the amount of voltage stored in Cst.

When a control signal on path 28 in the row associated with pixel 22E is asserted, switching transistors 30 and 30a will be turned on and a new data signal on paths 26 and 26a will be loaded into storage capacitor Cst. The new signal on capacitor Cst is applied to the gate of transistor 32 at node A relative to the source of transistor 32 at node AN, thereby adjusting the current through transistor 32 and adjusting the corresponding amount of light 40 that is emitted by light-emitting diode 38. If desired, the circuitry for controlling the operation of light-emitting diodes for pixels in display 14 (e.g., thin-film transistors, capacitors, etc. in pixel circuits such as the pixel circuit of FIG. 2) may be formed using other configurations (e.g., configurations that include circuitry for compensating for threshold voltage variations in drive transistor 32, configurations in which pixel 22E has emission control transistors, reset transistors, two or more capacitors, three or more transistors, and/or other circuitry). The pixel circuit of FIG. 2 is merely an illustrative example of a light-emitting pixel for display 14.

Figure 3:
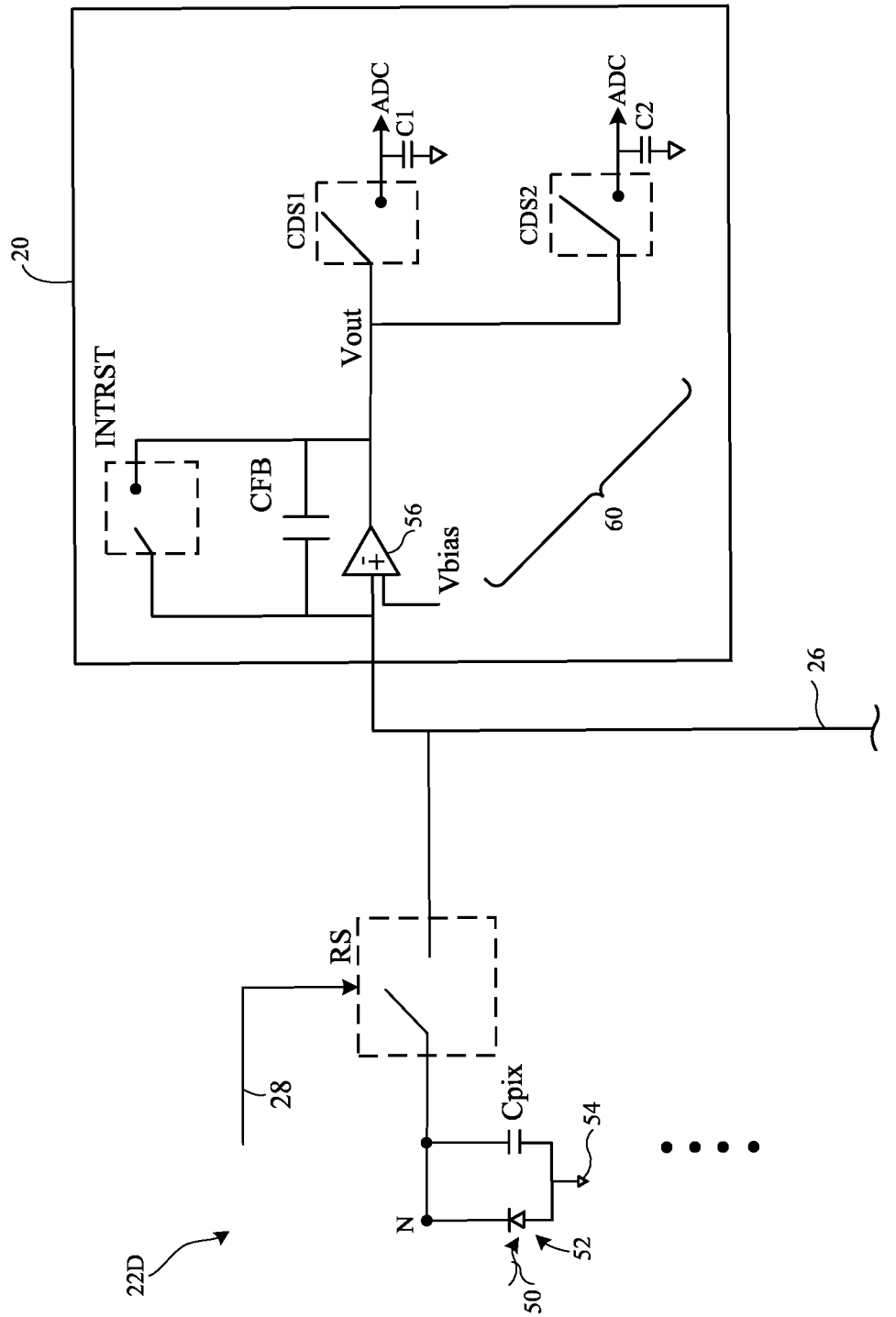
FIG. 3 is an illustrative light sensor circuit in accordance with an embodiment.

FIG. 3 is a circuit diagram of an illustrative light-sensing pixel 22D. Pixel 22D has a photodetector such as photodiode 52 for detecting light 50 during optical sensing. Light 50 may, for example, be infrared light, visible light, or ultraviolet light that has reflected/scattered from a user's finger or other external object. This light may be ambient light that has reflected/scattered towards pixel 22D from a user's finger or other object and/or may be light that was emitted from nearby (e.g., adjacent) light-emitting pixels 22E before being reflected/scattered towards pixel 22D from a user's finger or other object.

Photodiode 52 may have an anode coupled to ground 54 and a cathode (which may be shared with cathode CD of pixels 22E) coupled to node N. Capacitor Cpix may be coupled between ground 54 and node N. Row selection switch RS may be controlled by control signals (e.g., a gate line signal) on path 28. The optical sensor in the border region of display 14 may have multiple rows of pixels 22D that extend in a column along the length of the border region. Pixels 22D may be coupled to path 26, which is used in carrying measured light signals to control circuitry 20. Control circuitry 20 may have sensing circuitry 60 (e.g., correlated double sampling sample-and-hold circuitry) for receiving and processing signals from the photodiodes in pixels 22D.

Sensing circuitry 60 may have a sense amplifier formed from amplifier 56 and associated feedback capacitor CFB. Reset switch INTRST may be coupled between the output of amplifier 56 and its negative input. Amplifier 56 may receive bias voltage Vbias at its positive input. The output of each light-sensing pixel 22D may be received via row selection switch RS at the negative input of amplifier 56. The sample-and-hold circuitry for capturing and digitizing the output Vout of amplifier 56 may include first sample-and-hold switch CDS1 and second sample-and-hold switch CDS2. When switch CDS1 is closed, Vout may be sampled to sample-and-hold capacitor C1. When switch CDS2 is closed, Vout may be sampled to sample-and-hold capacitor C2. Switching circuitry and analog-to-digital control circuitry (ADC) may be used to digitize the voltages gathered using the sample-and-hold circuits. Signal measurements (e.g., light measurements gathered using sensing circuitry 60) may be processed by control circuitry to detect finger touch input and other user input.

During sensing with light-sensing pixel 22D, sensing circuitry 60 samples the voltage from pixel 22D before and after capacitor Cpix of pixel 22D gathers charge associated with incoming light 50. The amount of charge gathered on capacitor Cpix is proportional to the amount of light 50 that is received in a given measurement interval, so by measuring the output of pixels 22D (e.g., the charge on capacitor Cpix), the amount of detected light 50 during each measurement interval can be measured.

Figure 4:
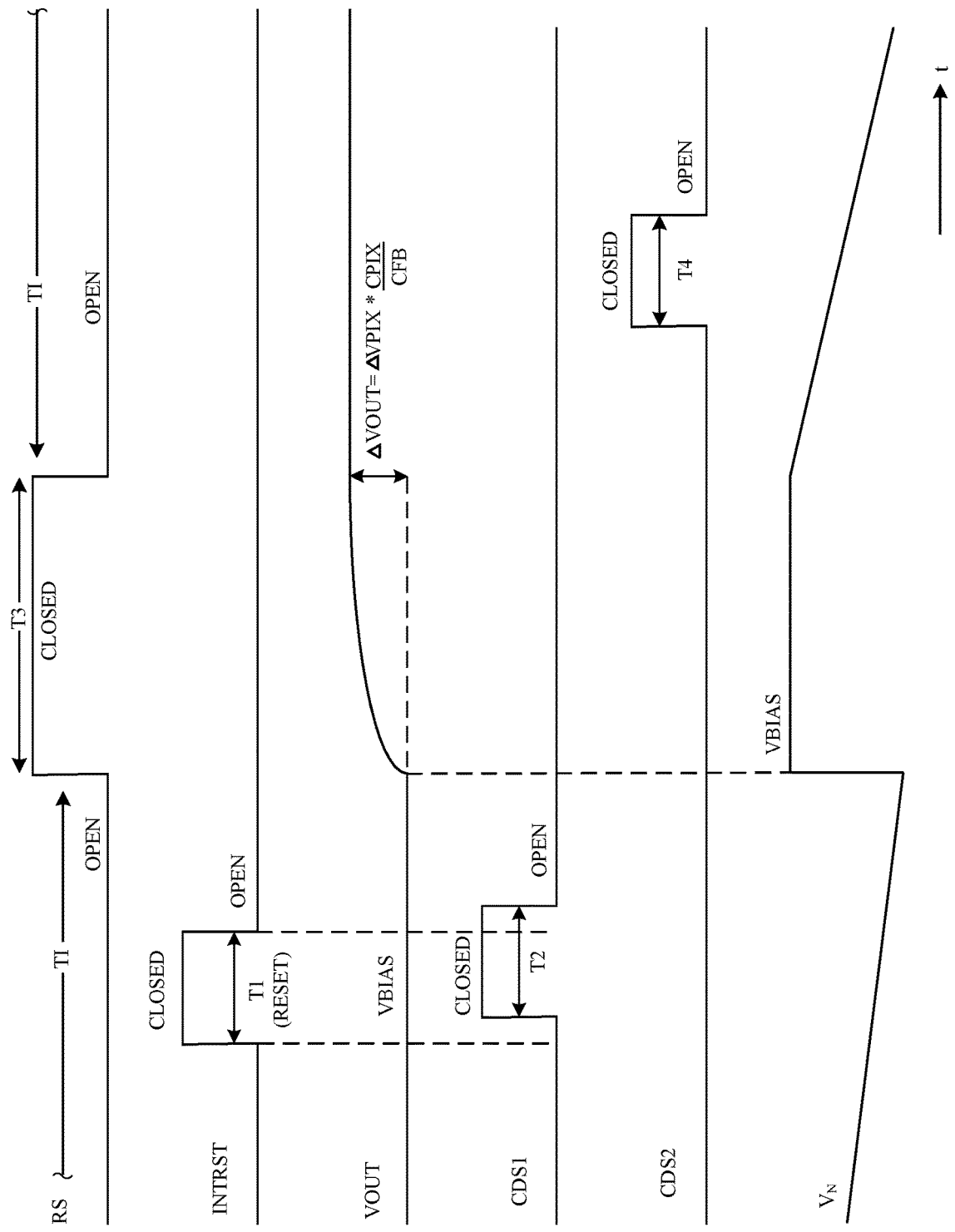
FIG. 4 is a timing diagram showing illustrative signals involved in operating the circuitry of FIG. 3 in accordance with an embodiment.

FIG. 4 is a timing diagram of signals involved in operating a display with pixels such as light-sensing pixels 22D of FIG. 3. During time period TI, row selection switch RS is open, light 50 is being received by pixel 22D, and this received light is creating current through diode 52 that is stored in capacitor Cpix. This amount of stored charge is measured using sensing circuitry 60 by opening and closing the switches of FIG. 3 in accordance with the timing diagram of FIG. 4. During time period T1, sense amplifier reset switch INTRST is closed while row select switch RS is open. The sense amplifier tries to equilibrate its inputs, so that voltage Vbias is driven onto node N. During period T2, switch CDS1 is closed to gather a first sample of output voltage Vout. Switch CDS1 remains closed until a certain time after INTRST is opened to ensure that the KT/C noise from CFB is captured. During period T3, row select switch RS is closed to transfer the stored charge from capacitor Cpix to sensing circuitry 60. This causes Vout to rise. The rise in Vout due to the closing of switch RS is proportional to the change in voltage at node N (ΔVpix, which is proportional to the amount of received light 50 during period TI) times Cpix divided by CFB. During period T4, switch CDS2 is closed to sample Vout after this change in voltage has occurred. Control circuitry can then process the measured difference between the two sampled values of Vout to determine the magnitude of light 50 and thereby determine if a finger is present on the optical sensor, whether a finger is in close proximity to the optical sensor, etc.

Figure 5:
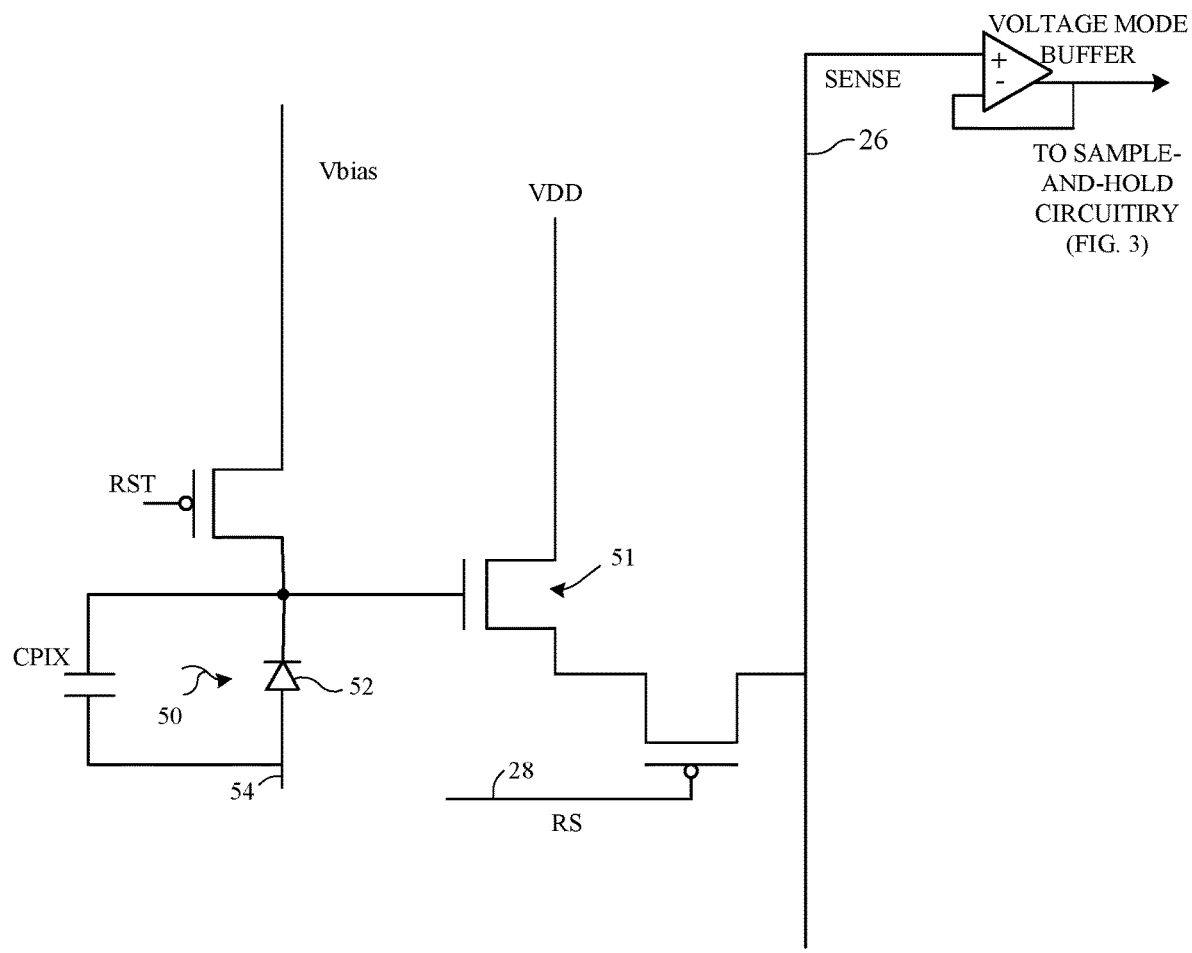
FIG. 5 is a circuit diagram of another illustrative light sensor circuit in accordance with an embodiment.
Figure 6:
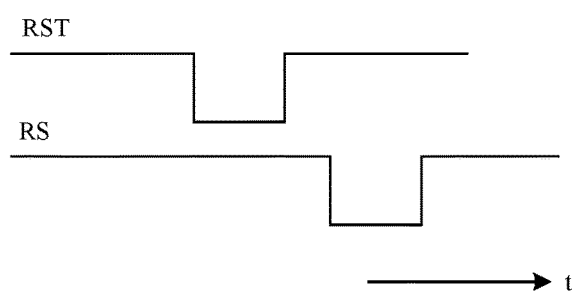
FIG. 6 is a timing diagram showing illustrative signals involved in operating the circuitry of FIG. 5 in accordance with an embodiment.

Another illustrative light-sensing pixel circuit is shown in FIG. 5. Illustrative control signals for operating light-sensing pixel 22D of FIG. 5 are shown in FIG. 6. This type of circuit may provide complete isolation of sense node N from the input to the sensing circuitry (coupled to the end of path 26) and can be used to perform double sampling. Low assertion of signal RST causes photodiode 52 and CPIX to be reset to VBIAS. Integration of photocurrent through photodiode 52 into CPIX commences after RST signal is deasserted. Transistor 51 is a source follower buffering the pixel voltage Vpix across Cpix. Upon assertion of signal RS, the buffered pixel voltage is connected to the sense node. The voltage mode buffer of FIG. 5 buffers the voltage and this buffered voltage is passed on to a sample-and-hold circuit (see CDS1 and CDS2 of FIG. 3). The integration time is the time between deassertion of signal RST and the assertion of signal RS. Other type of circuits can be used for light-sensing pixels 22D, if desired. The examples of FIGS. 3 and 5 are illustrative.

Figure 7:
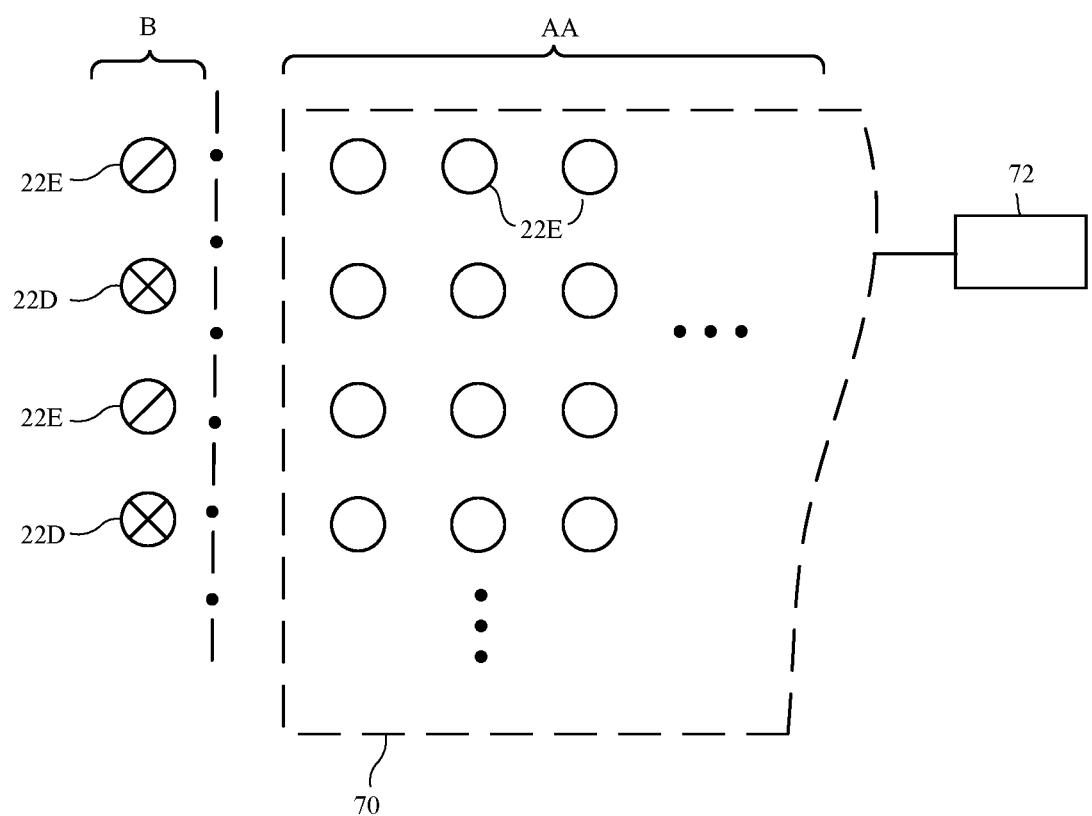
FIGS. 7, 8, and 9 are diagrams of illustrative layouts for light-emitting pixels and light sensing pixels in a display in accordance with an embodiment.
Figure 8:
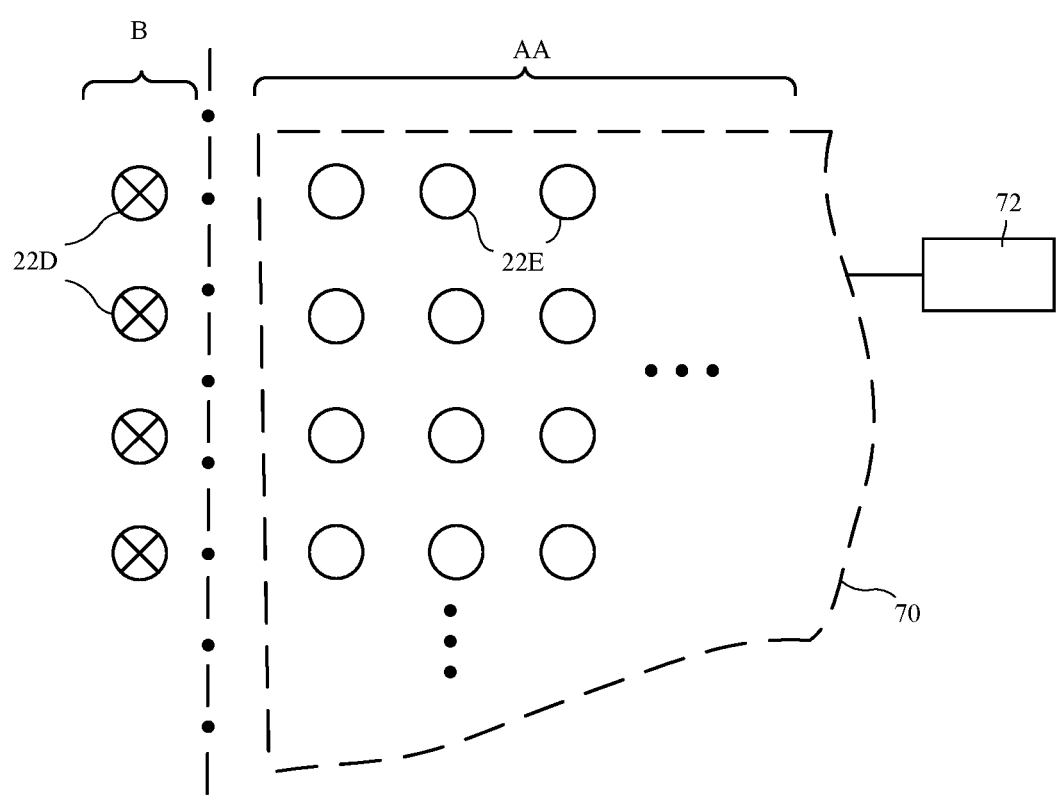
Figure 9:
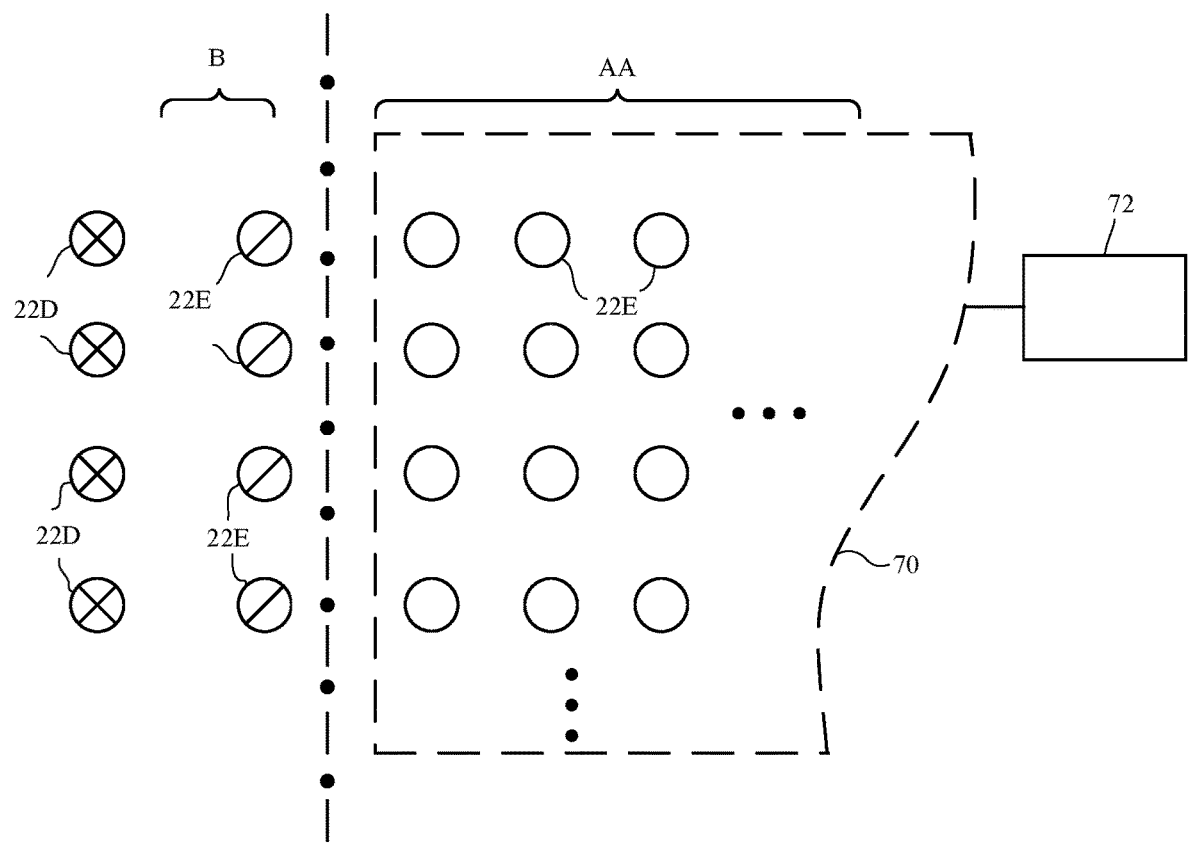

FIGS. 7, 8, and 9 show illustrative layouts for light-emitting pixels 22E and light sensing pixels 22D in display 14. Light-emitting pixels 22E in active area AA may include colored pixels (e.g., visible light pixels such as red, green, and blue pixels) for displaying colored images in active area AA. Images are not displayed in border region B. Border region B runs along the peripheral edge of display 14 and may contain one or more rows and/or columns of light-sensing and/or light-emitting pixels. In the example of FIG. 7, border region B has light-emitting pixels 22E (which may, if desired, emit visible, infrared, and/or ultraviolet light) and light-sensing pixels 22D (which may detect the emitted light after the emitted light has reflected and/or scattered from a user's fingers or other external objects). Using the optical sensor formed from pixels 22D and pixels 22E in border region B, display 14 may gather touch input (e.g., finger input) in border region B. To gather touch input seamlessly across display 14, display 14 may also have a two-dimensional touch sensor in active area AA. As an example, display 14 may have a two-dimensional capacitive touch sensor that overlaps active area AA, but that does not overlap any of border region B (see, e.g., the illustrative two-dimensional array of capacitive touch sensor electrodes 70 overlapping pixels 22E in active area AA and corresponding capacitive touch sensor processing circuitry 72).

In the example of FIG. 7, the optical sensing circuitry in border region B contains light-emitting pixels 22E and light-sensing pixels 22D that alternate along the length of elongated border region B (e.g., infrared light-emitting pixels and infrared light-sensing pixels are present in alternating rows of display 14). In the example of FIG. 8, border region B contains only a column of light-sensing pixels 22D (e.g., for detecting infrared light and/or visible light or ultraviolet light). Ambient light and/or light from nearby active area visible-light pixels 22E may be used to illuminate a user's fingers or other external objects during optical sensing with pixels 22D. In the example of FIG. 9, border region B contains a single column of light-emitting pixels 22E (e.g., infrared light-emitting pixels) and a single corresponding column of light-sensing pixels (e.g., infrared light-sensing pixels) 22D.

In these illustrative arrangements, border region B contains optical sensing circuitry that with a line of pixels (e.g., a column of pixels) that can serve as a one-dimensional (linear) optical sensor (e.g., a one-dimensional optical touch sensor or one-dimensional optical proximity sensor). Configurations in which border region B contains multiple lines (e.g., columns) of light-sensing pixels, contains multiple lines (e.g., columns) of alternating light-sensing and light-emitting pixels, and/or contains multiple lines (e.g., columns) of light-sensing pixels and multiple lines (e.g., columns) of light emitting pixels to create a two-dimensional optical sensor in border region B may also be used.

Figure 10:
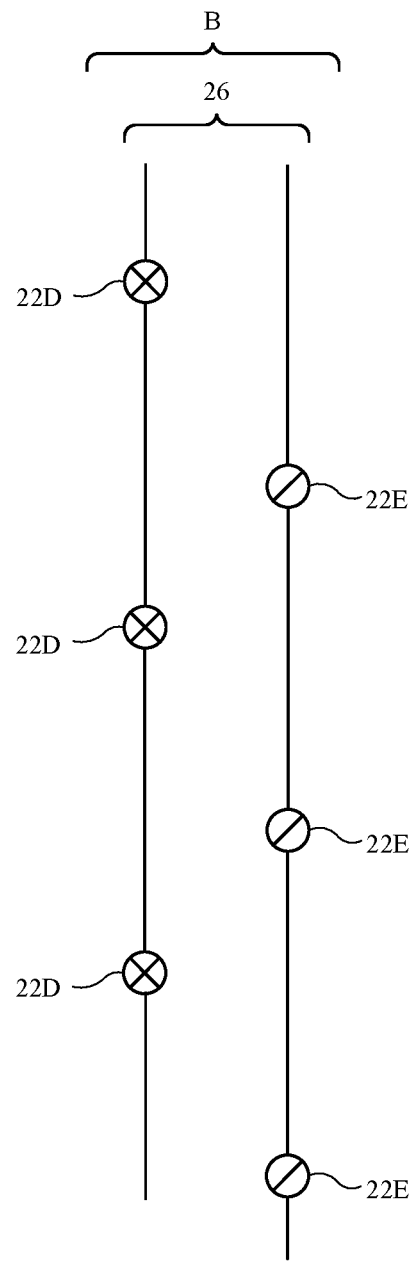
FIG. 10 is a diagram showing how interleaved light emitters and light detectors may be provided in a border region of a display using separate signal lines for sensing and driving in accordance with an embodiment.

FIG. 10 is a diagram showing how row-interleaved light-emitting pixels and light-sensing pixels in border region B may each have a respective vertical signal line in path 26. Pixels 22D extend along a first line (e.g., column) that runs along the length of border region B and pixels 22E extend along a parallel second line (e.g., column) that runs along the length of border region B. For example, each column of pixels 22E/22D such as the illustrative column of pixels in border region B of FIG. 10 may have a first line that is used as a data line for loading data into pixels 22E or for otherwise driving pixels 22E and a second line that is separate from the first line that is used as a sense line for gathering photodiode signals (sensed light signals) from pixels 22D.

Figure 11:
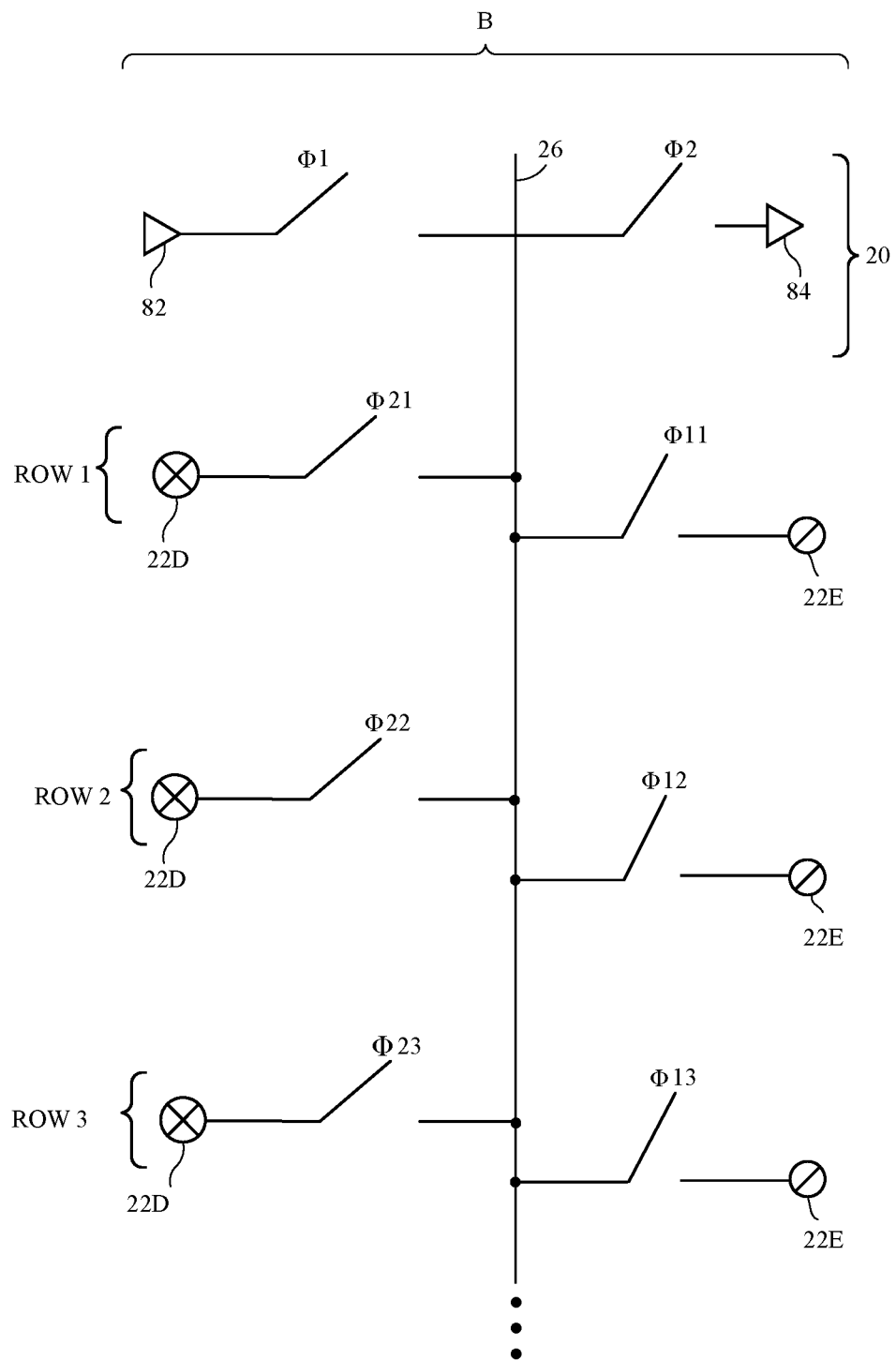
FIG. 11 is a diagram showing how interleaved light emitters and light detectors may be provided in a border region of a display using a shared signal line for sensing and driving in accordance with an embodiment.

FIG. 11 is a diagram showing how row-interleaved light-emitting pixels and light-sensing pixels in border region B may share a common vertical signal line in path 26. For example, each column of pixels 22E/22D such as the illustrative column of pixels in border region B of FIG. 11 may have signal line that is partly used for loading data into pixels 22E or for otherwise driving pixels 22E and that is partly used as a sense line for gathering photodiode signals (sensed light signals) from pixels 22D.

In the example of FIG. 11, switches Φ1 and Φ2 control whether driver 82 is used in driving signals to light-emitting pixels 22E (when switch Φ1 is closed to couple pixel driver circuit 82 to path 26 and switch Φ2 is open to isolate sensing circuitry 84 from path 26) or whether sense amplifier 84 is receiving light measurements carried over path 26 from light-sensing pixels 22D (when switch Φ1 is opened to isolate pixel driver circuit 82 from path 26 and switch Φ2 is closed to couple the input of sensing circuitry 84 to path 26). As shown in the timing diagram of FIG. 12, during operations 86, when switch Φ1 is closed, switches Φ11, Φ12, Φ13, etc. are closed in sequence to select successive rows of light-emitting pixels 22E to drive with driver 82. During operations 88, when switch Φ2 is closed, switches Φ21, Φ22, Φ23, etc. are closed in sequence to select successive rows of light-sensing pixels 22D to couple to the input of sensing circuitry 84. Other timing sequences for switches Φ1, Φ11, Φ12, Φ13, Φ2, Φ21, Φ22 and Φ23 are possible. For example, switches Φ21, Φ11, Φ22, Φ12, Φ23 and Φ13 may be engaged one at a time and in sequence, with appropriate assertion of switches Φ1 and Φ2 (e.g. Φ2, Φ1, Φ2, Φ1, Φ2, Φ1, respectively).

Figure 12:
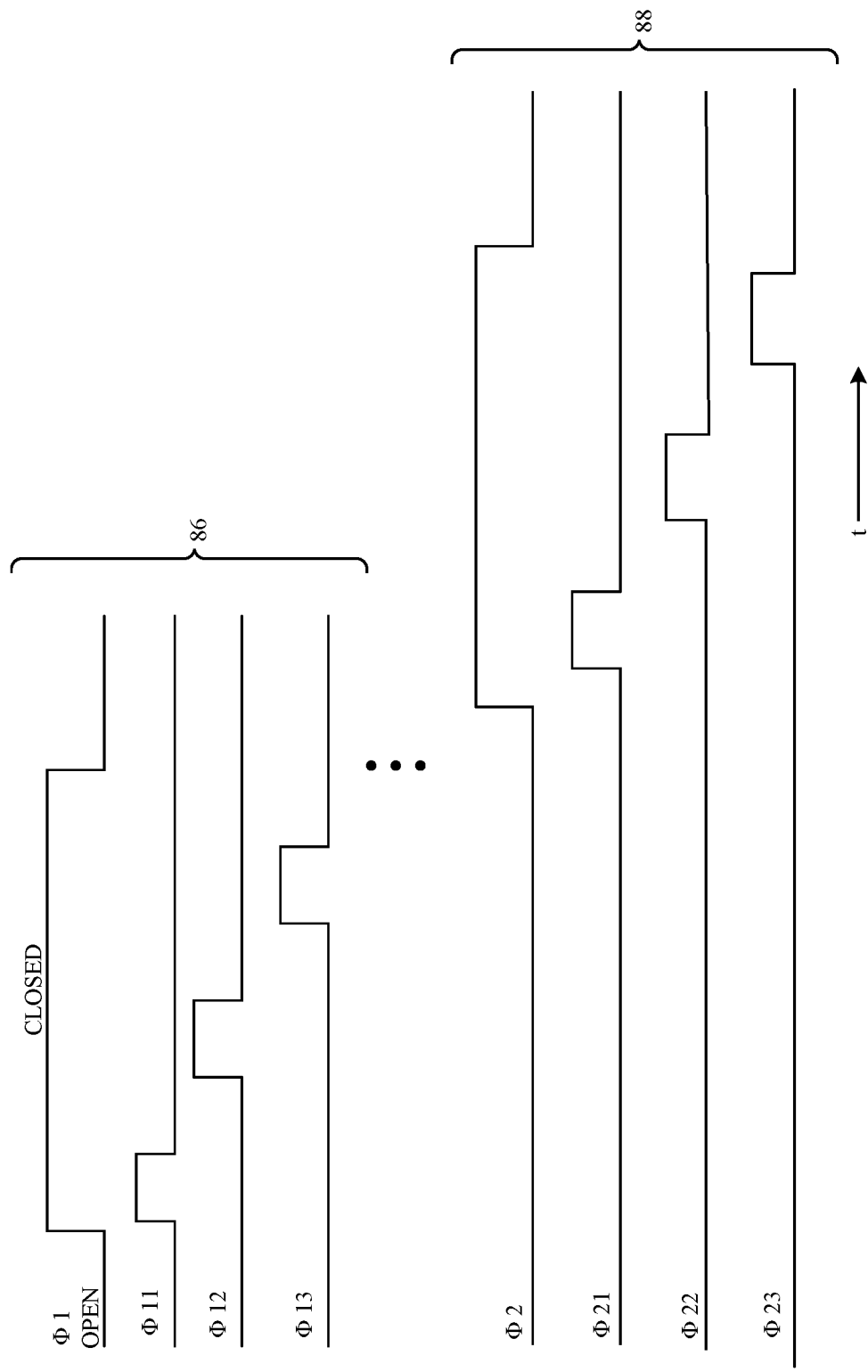
FIG. 12 is a timing diagram illustrating signals involved in operating the circuitry of FIG. 11 in accordance with an embodiment.
Figure 13:
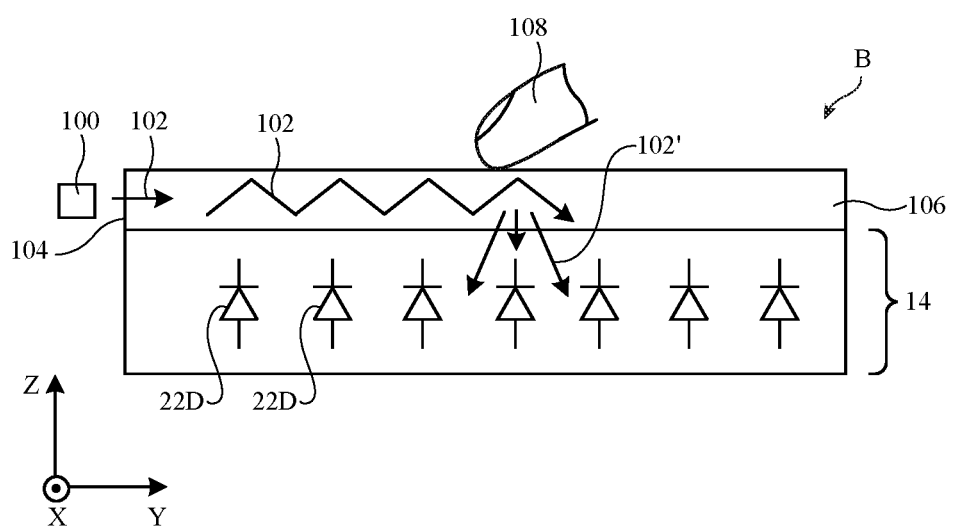
FIG. 13 is a diagram showing how a border region of a display in an electronic device may have an optical sensor that detects local frustration of total internal reflection using an array of border region light-sensing pixels in accordance with an embodiment.

In the example of FIG. 12, the optical sensing circuitry in elongated border region B contains light-sensing pixels 22D arranged along the length of border region B (e.g., infrared light-detecting pixels formed from infrared photodiodes or other infrared photodetectors and/or visible light-detecting pixels that are formed from visible photodiodes or other visible photodetectors. Light-emitting device 100 (e.g., a light-emitting diode or laser diode configured to emit light at an infrared and/or visible light wavelength) may emit light 102 into an adjacent edge 104 of a transparent member such as display cover layer 106. Display cover layer 106 may be formed from a transparent material such as glass, clear polymer, sapphire or other crystalline material, other transparent materials, and/or combinations of these materials and may overlap all of the pixels in display 14. Display cover layer 106 may, as an example, have a rectangular shape or other shape that overlap the pixels in active area AA and that extends over border areas such as border region B of FIG. 13.

Light 102 that is emitted from light-emitting device 100 may be guided between the upper and lower surface of display cover layer 106 along the length of border region B in accordance with the principal of total internal reflection. In the absence of external objects such as user finger 108, light 102 does not penetrate into the interior of the electronic device in which display 14 is mounted (e.g., light 102 does not reach any of the overlapped light-sensing pixels 22D). At a location of the display cover layer 106 where the surface of layer 106 is touched by finger 108 or external object, total internal reflection will be locally defeated. This will cause light 102 to exit outwardly from display cover layer 106, where light 102 will strike finger 108 and be scattered back downwards by finger 108 as scattered light 102'. The location where scattered light 102' is present may be detected by analyzing the output of light-sensing pixels 22D (e.g., by detecting the elevated output of the light-sensing pixel 22D at the location where finger 108 scattered light 102' inwardly). In this way, the location of finger 108 along dimension Y (e.g., along the length of the border region B of display 14) may be measured. With configurations of the type shown in FIG. 13, there may be one or more parallel columns of light-sensing pixels 22D running along the length of border region B. Additional columns of pixels 22D may, as an example, be included to provide additional location information (e.g., location along dimension X in the example of FIG. 13 in addition to location along dimension Y).

Display 14 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made by those skilled in the art without departing from the scope and spirit of the described embodiments. The foregoing embodiments may be implemented individually or in any combination.

Table of Reference Numerals

| | | | |
|---|---|---|---|
| 14 | display | 16, 18, 20 | display control circuitry |
| 25, 26, 26a, 28 | paths | 24 | substrate |
| 22 | pixels | L, R, T, B | edges |
| 30, 32, 32a, 30a, 51 | transistors | Cst | capacitor |
| A, B | nodes | AN | anode |
| CD | cathode | 38 | light-emitting diode |
| 40 | light | 34, 36 | terminals |
| 22D | light-sensing pixel | RS, INTRST, CDS1, CDS2 | switches |
| N | node | 52 | photodiode |
| 50 | light | 60 | sensing circuitry |
| 56 | amplifier | CFB | capacitor |
| C1, C2 | capacitors | Cpix | capacitor |
| 70 | electrodes | 72 | touch sensor processing circuitry |
| B | border region | AA | active area |
| 82 | driver | 84 | sensing circuitry |
| 86, 88 | operations | 100 | light-emitting device |
| 102, 102' | light | 108 | finger |
| 106 | display cover layer | 104 | edge |

What is claimed is:

1. A display having an active area and a border region that runs along a peripheral edge of the active area, comprising:
    a substrate; and
    an array of pixels formed in rows and columns on the substrate, wherein:
        a first portion of the array of pixels comprises an array of light-emitting pixels on the substrate and in the active area,
        the array of light-emitting pixels is configured to display an image in the active area,
        the active area does not contain light detectors,
        a second portion of the array of pixels comprises light-sensing pixels on the substrate, in the border region, and configured to measure light indicative of user input over the border region, the light-sensing pixels at least partly forming an optical sensor.

2. The display defined in claim 1 further comprising a capacitive touch sensor that overlaps the active area.

3. The display defined in claim 1 wherein the optical sensor comprises an infrared optical sensor.

4. The display defined in claim 1 wherein the light-sensing pixels comprise infrared light-sensing pixels.

5. The display defined in claim 1 wherein the light-sensing pixels comprise infrared light-sensing pixels and wherein the optical sensor further comprises infrared light-emitting pixels in the array of pixels.

6. The display defined in claim 5 wherein the infrared light-sensing pixels and the infrared light-emitting pixels are arranged in two parallel lines in the array of pixels extending along the border region.

7. The display defined in claim 5 wherein the infrared light-sensing pixels and the infrared light-emitting pixels alternate with each other along the border region.

8. The display defined in claim 1 wherein the border region is free of light-emitting pixels and the array of light-emitting pixels contains only visible light-emitting pixels.

9. The display defined in claim 1 wherein the optical sensor forms an optical touch sensor configured to detect touch input over the border region and wherein the display further comprises a non-optical two-dimensional touch sensor in the active area that is configured to detect touch input over the active area.

10. The display defined in claim 9 wherein the light-sensing pixels comprise infrared light-sensing pixels and wherein the non-optical two-dimensional touch sensor comprises a two-dimensional capacitive touch sensor that overlaps the active area and that does not overlap the border region.

11. A display, comprising:
    a substrate layer;
    active area pixels on the substrate layer configured to display an image in an active area that is free of light sensing circuitry;
    a capacitive touch sensor overlapping the active area configured to gather touch input over the active area;
    an optical sensor that has infrared light-emitting pixels on the substrate layer and infrared light-sensing pixels on the substrate layer, wherein the optical sensor is in a border region that runs along a peripheral edge of the active area and is configured to gather touch input over the border region; and
    display control circuitry formed along an edge of the substrate layer and coupled to the active area pixels, the infrared light-emitting pixels, and the infrared light-sensing pixels via corresponding parallel signal lines.

12. The display defined in claim 11 wherein the active area pixels comprise thin-film visible-light-emitting pixels on the substrate layer in the active area.

13. The display defined in claim 12 wherein the infrared light-sensing pixels comprise thin-film infrared light-sensing pixels on the substrate layer in the border region.

14. The display defined in claim 13 wherein the infrared light-emitting pixels comprise thin-film infrared light-emitting pixels on the substrate layer in the border region.

15. The display defined in claim 14 further comprising capacitive touch sensor electrodes that overlap the active area, wherein no capacitive touch sensor electrodes overlap the border region.

16. A display, comprising:
a substrate; and
an array of pixels formed in rows and columns on the substrate, each pixel in the array comprising thin-film circuitry on the substrate, wherein the array of pixels comprises:
active area pixels on the substrate that are configured to display an image in an active area that is free of light sensing circuitry; and
light-sensing pixels on the substrate that extend along a border region running along a peripheral edge of the active area and that sense light indicative of user input outside of the active area, wherein the light-sensing pixels at least partly form an optical sensor in the border region and wherein the border region does not have pixels that display images.

17. The display defined in claim 16 further comprising capacitive touch sensor circuitry overlapping the active area, wherein the border region is not overlapped by any capacitive touch sensor circuitry.

18. The display defined in claim 17 wherein the light-sensing pixels comprise infrared light-sensing pixels and wherein the optical sensor comprises infrared light-emitting pixels in the array of pixels.

19. The display defined in claim 18 wherein the border region contains a signal line that is configured to supply signals to the infrared light-emitting pixels and that is configured to carry signals from the infrared light-sensing pixels.

20. The display defined in claim 18 wherein the border region contains a first signal line that is configured to supply signals to the infrared light-emitting pixels and a second signal line that is configured to carry signals from the infrared light-sensing pixels.

21. The display defined in claim 16 further comprising a transparent display cover layer that overlaps the active area and the border region, the optical sensor further comprising a light-emitting device that is configured to emit light into an edge of the transparent display cover layer that is guided by total internal reflection along the border region until the total internal reflection is locally defeated by an external object on a surface of the transparent display cover layer, thereby scattering light through the transparent display cover layer towards the light-sensing pixels, wherein the optical sensor is configured to measure a location of the external object on the surface using output from the light-sensing pixels that extend along the border region.

22. The display defined in claim 21 wherein the light-emitting device is an infrared light-emitting device.

23. The display defined in claim 1, wherein each of the light-emitting pixels and the light-sensing pixels in the array of pixels comprises thin-film circuitry on the substrate.

* * * * *